United States Patent
Hu et al.

(10) Patent No.: US 9,893,273 B2
(45) Date of Patent: Feb. 13, 2018

(54) LIGHT ELEMENT DOPED LOW MAGNETIC MOMENT MATERIAL SPIN TORQUE TRANSFER MRAM

(71) Applicants: International Business Machines Corporation, Armonk, NY (US); Samsung Electronics Co., Ltd., Suwon-si, Gyeonggi-do (KR)

(72) Inventors: Guohan Hu, Yorktown Heights, NY (US); Junghyuk Lee, Seoul (KR); Jeong-Heon Park, Seoul (KR)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/094,052

(22) Filed: Apr. 8, 2016

(65) Prior Publication Data
US 2017/0294575 A1    Oct. 12, 2017

(51) Int. Cl.
| | |
|---|---|
| H01L 43/08 | (2006.01) |
| H01L 43/10 | (2006.01) |
| H01L 43/12 | (2006.01) |
| G11C 11/16 | (2006.01) |
| H01L 43/02 | (2006.01) |

(52) U.S. Cl.
CPC ............ *H01L 43/10* (2013.01); *G11C 11/161* (2013.01); *H01L 43/02* (2013.01); *H01L 43/08* (2013.01); *H01L 43/12* (2013.01)

(58) Field of Classification Search
CPC ....... H01L 43/08; H01L 27/228; H01L 43/02; H01L 43/10; H01L 43/12

USPC .......................................................... 257/421
See application file for complete search history.

(56) References Cited

U.S. PATENT DOCUMENTS

| | | | |
|---|---|---|---|
| 7,242,045 B2 | 7/2007 | Nguyen et al. | |
| 7,256,971 B2 | 8/2007 | Horng et al. | |
| 7,280,389 B2 | 10/2007 | Guo | |
| 7,538,402 B2* | 5/2009 | Fukumoto | B82Y 25/00 |
| | | | 257/421 |
| 8,472,151 B2 | 6/2013 | Wang et al. | |
| 8,546,896 B2 | 10/2013 | Lottis | |
| 8,592,927 B2 | 11/2013 | Jan | |

(Continued)

OTHER PUBLICATIONS

Hu, Guohan et al.; "Low Magnetic Moment Materials for Spin Transfer Torque Magnetoresistive Random Access Memory Devices"; U.S. Appl. No. 15/017,001, filed Feb. 5, 2016.

(Continued)

*Primary Examiner* — Monica D Harrison
(74) *Attorney, Agent, or Firm* — Cantor Colburn LLP; Vazken Alexanian (57) ABSTRACT

Techniques relate to forming a semiconductor device. A magnetic pinned layer is formed adjacent to a tunnel barrier layer. A magnetic free layer is formed adjacent to the tunnel barrier layer, such that the tunnel barrier layer is sandwiched between the magnetic pinned layer and the magnetic free layer. The magnetic free layer includes a first magnetic layer, a second magnetic layer disposed on top of the first magnetic layer, and a third magnetic layer disposed on top of the second magnetic layer. The second magnetic layer of the magnetic free layer includes an additional material, and the additional material is a selection of at least one of Be, Mg, Al, Ca, B, C, Si, V, Cr, Ti, and Mn.

20 Claims, 6 Drawing Sheets

(56) References Cited

U.S. PATENT DOCUMENTS

| | | |
|---|---|---|
| 8,698,260 B2 | 4/2014 | Jan et al. |
| 8,836,061 B2 | 9/2014 | Zhou et al. |
| 9,040,178 B2 | 5/2015 | Zhao et al. |
| 2005/0174834 A1 | 8/2005 | Kim et al. |
| 2013/0119495 A1* | 5/2013 | Vetr ................. H01L 43/08 257/421 |
| 2016/0072049 A1* | 3/2016 | Noma ................. G11B 5/314 257/421 |

OTHER PUBLICATIONS

List of IBM Patents or Patent Applications Treated as Related—Date Filed: Apr. 20, 2016; 1 page.

\* cited by examiner

LIGHT ELEMENT DOPED LOW MAGNETIC MOMENT MATERIAL SPIN TORQUE TRANSFER MRAM

BACKGROUND

The present invention relates generally to semiconductors, and more specifically, to doping with light elements to produce a low magnetic moment material for spin torque transfer (STT) magnetic random access memory.

Magnetic random access memory (MRAM) is a non-volatile computer memory (NVRAM) technology. Unlike conventional RAM chip technologies, in MRAM, data is not stored as electric charge or current flows, but by magnetic storage elements. The elements are formed using two ferromagnetic plates, separated by a thin insulating layer. One of the two plates is a permanent magnet set to a particular polarity; the other's magnetic field can be changed. This configuration is known as a spin valve and is the simplest structure for a MRAM bit. A memory device is built from a grid of such "cells".

A typical method of reading is accomplished by measuring the electrical resistance of the cell. A particular cell is (typically) selected by turning on an associated access transistor which passes current from a supply line through the cell to ground. Due to the magnetic tunnel effect, the electrical resistance of the cell changes with the relative orientation of the fields between the two plates. By measuring the resulting current, the resistance associated with any particular cell can be determined, and from this magnetic orientation of the writable plate (i.e., free layer). Typically, if the two plates have the same orientation, the cell is considered to hold a value of "0". While if the two plates are of opposite orientation, the resistance will be higher and will hold a value of "1".

SUMMARY

According to one or more embodiments, a method of forming a semiconductor device is provided. The method includes forming a magnetic pinned layer adjacent to a tunnel barrier layer, and forming a magnetic free layer adjacent to the tunnel barrier layer, such that the tunnel barrier layer is sandwiched between the magnetic pinned layer and the magnetic free layer. The magnetic free layer includes a first magnetic layer, a second magnetic layer disposed on top of the first magnetic layer, and a third magnetic layer disposed on top of the second magnetic layer. The second magnetic layer of the magnetic free layer includes an additional material, and the additional material is a selection of at least one of Be, Mg, Al, Ca, B, C, Si, V, Cr, Ti, and Mn.

According to one or more embodiments, a semiconductor device is provided. The semiconductor device includes a magnetic pinned layer adjacent to a tunnel barrier layer, and a magnetic free layer adjacent to the tunnel barrier layer, such that the tunnel barrier layer is sandwiched between the magnetic pinned layer and the magnetic free layer. The magnetic free layer includes a first magnetic layer, a second magnetic layer disposed on top of the first magnetic layer, and a third magnetic layer disposed on top of the second magnetic layer. The second magnetic layer of the magnetic free layer includes an additional material, and the additional material is a selection of at least one of Be, Mg, Al, Ca, B, C, Si, V, Cr, Ti, and Mn.

According to one or more embodiments, a semiconductor device is provided. The semiconductor device includes a magnetic pinned layer adjacent to a tunnel barrier layer, and a magnetic free layer adjacent to the tunnel barrier layer, such that the tunnel barrier layer is sandwiched between the magnetic pinned layer and the magnetic free layer. The magnetic free layer includes a first magnetic layer, a second magnetic layer disposed on top of the first magnetic layer, and a third magnetic layer disposed on top of the second magnetic layer. The second magnetic layer of the magnetic free layer includes an additional material, and the additional material is a selection of at least one of Be, Mg, Al, Ca, B, C, Si, V, Cr, Ti, and Mn. The second magnetic layer is a single layer and the additional material constitutes 10-80% of the second magnetic layer, or the second magnetic layer includes a combination of a magnetic layer and a non-magnetic layer to form a multilayered structure. The non-magnetic layer includes the additional material.

BRIEF DESCRIPTION OF THE DRAWINGS

FIG. 5A1 is a graph depicting magnetization versus perpendicular field loop of a conventional free layer with a total thickness of 18 Å and an effective CoFeB thickness of 18 Å.

FIG. 5A2 is a graph depicting magnetization versus in-plane field loop of a conventional free layer with a total thickness of 18 Å and an effective CoFeB thickness of 18 Å.

FIG. 5B1 is a graph depicting magnetization versus perpendicular field loop of a conventional free layer with a total thickness of 12 Å and an effective CoFeB thickness of 12 Å.

FIG. 5B2 is a graph depicting magnetization versus in-plane field loop of a conventional free layer with a total thickness of 12 Å and an effective CoFeB thickness of 12 Å.

FIG. 5C1 is a graph depicting magnetization versus perpendicular field loop of a free layer doped with Mg metal to have a total thickness of 17 Å and an effective CoFeB thickness of 12 Å according to one or more embodiments.

FIG. 5C2 is a graph depicting magnetization versus in-plane field loop of a free layer doped with Mg metal to have a total thickness of 17 Å and an effective CoFeB thickness of 12 Å according to one or more embodiments.

FIG. 5D1 is a graph depicting magnetization versus perpendicular field loop of a free layer doped with Ti metal to have a total thickness of 14 Å and an effective CoFeB thickness of 12 Å according to one or more embodiments.

FIG. 5D2 is a graph depicting magnetization versus in-plane field loop of a free layer doped with Ti metal to have a total thickness of 14 Å and an effective CoFeB thickness of 12 Å according to one or more embodiments.

DETAILED DESCRIPTION

Various embodiments are described herein with reference to the related drawings. Alternative embodiments may be devised without departing from the scope of this document.

It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Magnetic random access memory (MRAM) is a nonvolatile solid state memory technology compatible with standard semiconductor manufacturing. Information is stored in the magnetic orientation of a free layer film in relation to that of a reference film. Reading the state of the cell or bit is accomplished by measuring the electrical resistance of a magnetic tunnel junction formed by a sandwich of the free layer, a tunneling barrier, and the reference layer.

Writing the bit can be achieved in several ways, depending on the technology in use. In spin-transfer torque MRAM, external fields are not used in the writing process. Instead, electrical currents passing between the reference layer and the free layer film carry not only a charge current but in addition a spin current. This spin current transferred between the two magnetic films (i.e., the reference layer and the free layer) acts to orient the free layer either parallel or antiparallel to the reference layer, depending on the sign (i.e., direction) of the electrical current.

Figure 1:
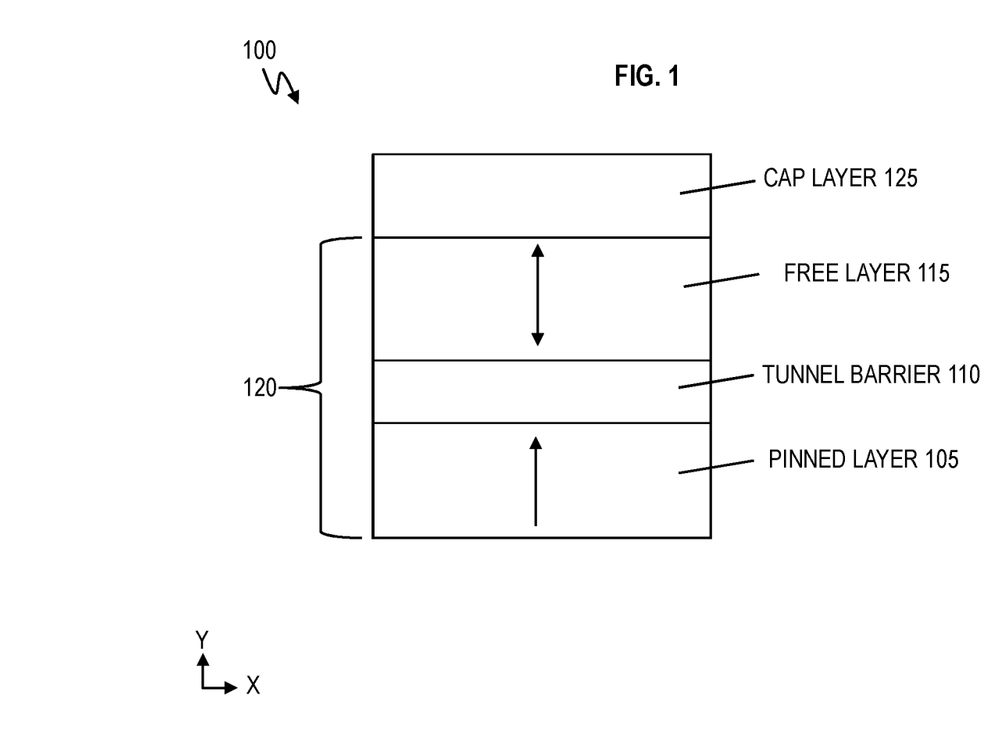
FIG. 1 is a cross-sectional view of a spin torque transfer (STT) MRAM device according to one or more embodiments.

Now turning to the figures, FIG. 1 is a cross-sectional view of a spin torque transfer (STT) MRAM device 100 according to one or more embodiments. The STT MRAM is a 2-terminal device with a magnetic pinned layer 105 (also referred to as a fixed layer or reference layer), tunnel barrier layer 110, and magnetic free layer 115 in a magnetic tunnel junction stack 120. A cap layer 125 may be formed on top of the magnetic free layer 115.

Although FIG. 1 depicts the magnetic free layer 115 on top of the tunnel barrier layer 110 and the tunnel barrier 110 on top of the magnetic pinned layer 105, the inverse configuration may be utilized as well. For example, it is contemplated that the magnetic pinned layer 105 may be disposed on top of the tunnel barrier 110 while the tunnel barrier 110 is on top of the magnetic free layer 115 in one implementation. It should be appreciated that the magnetic free layer 115 can be either above or below the magnetic pinned layer 105.

The magnetization (i.e., the magnetic moment) of the magnetic pinned layer 105 is fixed in one direction (such as, e.g., pointing up in this example and can be pointing down in another example) as represented by the arrow pointing up. The magnetic free layer 115 has a magnetization (i.e., magnetic moment) that can be flipped to point up or point down, as represented by a double arrow.

A current passed down through the magnetic tunnel junction 120 makes the magnetic free layer 115 parallel to the magnetic pinned layer 105. On the other hand, a current passed up through the magnetic tunnel junction 120 makes the magnetic free layer 115 anti-parallel to the magnetic pinned layer 105. A smaller current (of either polarity) is used to read the resistance of the MRAM device 100 (i.e., the MTJ 120), which depends on the relative orientations of the magnetizations of the free and pinned layers. The resistance is typically higher when the magnetizations are antiparallel (i.e., magnetic moments are pointing in opposite directions); the resistance is lower when the magnetizations are parallel, though this can be reversed, depending on the materials utilized.

The main challenge is to lower the switching current needed to flip (i.e., write) the magnetization of the magnetic free layer 115. In STT MRAM devices, a large current is needed to realize fast switching. In particular, in the fast switching regime such as greater than and/or equal to ($\leq$) 10 nanoseconds (ns), the so called overdrive current is (the difference between the switching current I at a certain pulse width and the critical current inversely proportionally to the write pulse, as shown in the following equation $$\eta \frac{I - I_c}{e} t_p \propto \frac{m}{\mu_B}, \qquad \text{(Equation 1)}$$

where $I-I_c$ is the overdrive current, I is the current needed to switch the magnetization of the free layer at pulse width $t_p$, $\eta$ is the spin polarization of the magnetic materials, $t_p$ is pulse width, m is the total moment of the free layer material, and $\mu_B$ is the Bohr magneton, which is a constant. The equation 1 suggests that, to minimize the switching current at a certain pulse width, the free layer moment of the free layer has to be reduced.

Figure 2:
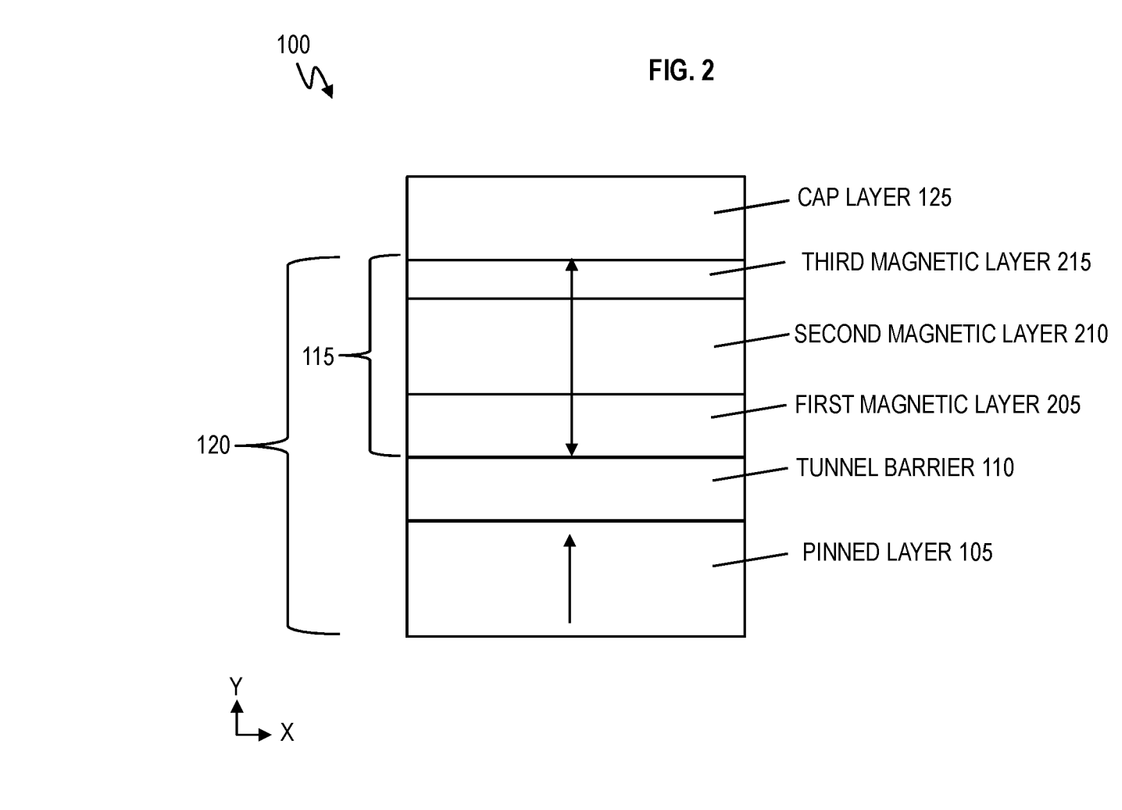
FIG. 2 is a cross-sectional view of the STT MRAM device depicting a doped magnetic free layer according to one or more embodiments.
Figure 3:
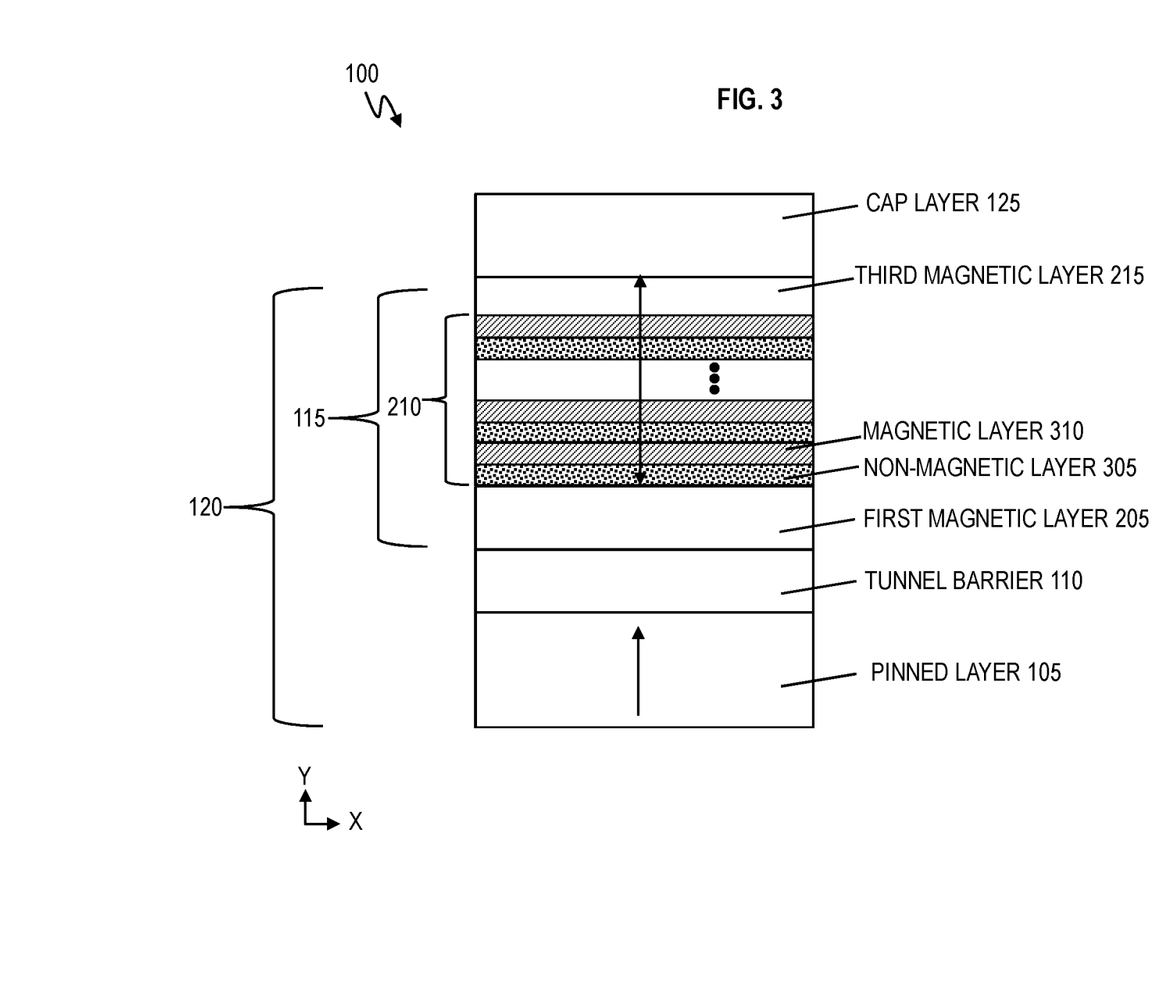
FIG. 3 is a cross-sectional view of the STT MRAM device depicting a doped multilayer magnetic free layer according to one or more embodiments.

Moreover, a low moment free layer is also advantageous for the device's deep bit write error rate (WER) performance. The bit write error rate characterizes how reliable a bit can be written. One way to reduce the free layer moment is to make the free layer thinner. However, it has been shown to be challenging to reduce the free layer thickness in the state-of-the-art, and thus challenging to reduce the total moment of the widely used Co, Fe, and CoFeB based free layers. This is due to the fact that the transition metals have higher surface energy than the underlying MgO tunnel barrier, which promotes a 3D island growth of the transition metal free layer. Free layers thinner than a predetermined thickness of approximately 15-20 Å (1.5-2 nm) become discontinuous and weakly exchange coupled. Discontinuous means that the free layer may have holes or areas that are not connected to one another throughout the free layer. Weakly exchanged coupled means that the magnetic moments in different regions are not well aligned with each other. Instead, the magnetizations of the different regions can have different orientations. This sets a limit on free layer moment reduction by simply reducing the free layer thickness Embodiments disclose a technique to form a low moment free layer with perpendicular magnetic anisotropy. FIG. 2 is a cross-sectional view of the spin torque transfer MRAM device 100 depicting a doped magnetic free layer 115 according to one or more embodiments. FIG. 3 is a cross-sectional view of the spin torque transfer (STT) MRAM device 100 depicting a doped multilayer magnetic free layer 115 according to one or more embodiments.

Embodiments disclose techniques to obtain a low moment magnetic free layer 115 with perpendicular magnetic anisotropy by doping and/or laminating the Co, Fe and/or CoFeB based free layer with light elements as illustrated in FIGS. 2 and 3. The light elements may include Be, Mg, Al, Ca, B, C, Si, V, Cr, Ti, and/or Mn. Light elements refer elements that have a low atomic number. Although examples are discussed herein with respect to Co, Fe, and/or CoFeB, it should be appreciated that the magnetic free layer 115 is not limited to being a Co, Fe, and/or CoFeB based layer(s).

By doping and/or laminating the magnetic free layer 115 with light elements, thus increasing the physical thickness of the magnetic free layer 115 in the y-axis, a strongly exchange coupled free layer 115 with effective CoFeB thickness down to 10-12 Å (1.0-1.2 nm) can be achieved. The magnetic free layer 115 having an effective CoFeB thickness of 10-12 Å is reduced from a thickness of approximately 18 Å (1.8 nm) in a conventional Co, Fe and CoFeB based free layer with perpendicular anisotropy. Light element doping and/or lamination are beneficial in maintaining the low Gilbert damping constant, $\alpha$, of the magnetic free layer 115. The Gilbert damping constant, $\alpha$, refers to magnetic damping that occurs when a magnetic field moves through a conductor (or vice versa), such as the free layer. When a magnetic field (magnet) moves through a conductor an eddy current is induced in the conductor due to the magnetic field's movement. The flow of electrons in the conductor creates an opposing magnetic field to the magnet which results in damping of the magnet.

In FIGS. 2 and 3, the magnetic free layer 115 is composed of three parts. The magnetic free layer 115 includes a first magnetic layer 205 disposed on top of the tunnel barrier layer 110, a second magnetic layer 210 disposed on top of the first magnetic layer 205, and a third magnetic layer 215 disposed on top of the second magnetic layer 210. The first magnetic layer 205 is a layer containing Co, Fe and/or CoFeB and has a thickness ranging from 5-10 Å (0.5-1 nm).

In the magnetic free layer 115, the second magnetic layer 210 may be a single layer containing Co, Fe, and/or CoFeB doped with light elements discussed herein. The doping level of light elements may range from 10%-80% of the total composition of the second magnetic layer 210. The second magnetic layer may have a thickness ranging from 1.5-15 Å (0.15-1.5 nm).

Additionally, FIG. 3 illustrates that the second magnetic layer 210 may also be a multilayer structure containing alternating layers of a magnetic layer 310 and a non-magnetic layer 305. The magnetic layer 310 is a layer containing Co, Fe, and/or CoFeB, and the magnetic layer 310 has a thickness ranging from 0.5-5 Å (0.05-0.5 nm). The non-magnetic layer 305 is composed of light elements (discussed herein), and the non-magnetic layer 305 has a thickness ranging from 0.5-5 Å (0.05-0.5 nm). The non-magnetic layer 305 may be disposed on top of the magnetic layer 310, and/or the magnetic layer 310 may be disposed on top of the non-magnetic layer 305. The combination of the non-magnetic layer 305 and the magnetic layer 310 may repeat 0-5 times, where 0 repeats corresponds to only one non-magnetic layer 305 and one magnetic layer 310. Accordingly, 5 repeats correspond to 6 non-magnetic layers 305 and 6 magnetic layers 310 in an alternating manner.

In one implementation of the second magnetic layer 210, there may be different kinds of light elements (as discussed above, e.g., Be, Mg, Al, Ca, B, C, Si, V, Cr, Ti, and/or Mn) mixed in this multilayer structure. In one implementation of the second magnetic layer 210, one non-magnetic layer 305 may be formed of one of the light elements (e.g., Be), another non-magnetic layer 305 may be formed of another one of the light elements (e.g., Mg), one non-magnetic layer 305 may be formed of one of the light elements (e.g., Al), yet another non-magnetic layer 305 may be formed of another one of the light elements (e.g., Ca), and so forth.

In another implementation of the second magnetic non-magnetic layer 305, one non-magnetic layer 305 may be formed of two or more light elements (e.g., Be and Mg), another non-magnetic layer 305 may be formed of another two or more of the light elements (e.g., Al and Ca), one non-magnetic layer 305 may be formed of two or more of the light elements (e.g., B and C), yet another non-magnetic layer 305 may be formed of another two or more of the light elements (e.g., Si and V), and so forth.

In FIGS. 2 and 3, the third magnetic layer 215 is another layer of Co, Fe and/or CoFeB, and the third magnetic layer 215 may have a thickness ranging from about 1-5 Å (0.1-0.5 nm).

The cap layer 125 may be an oxide layer. Example materials of the cap layer 125 may be include MgO, $TaO_x$, $VO_x$, $WO_x$, $AlO_x$, $CaO_x$, $TiO_x$ and/or a mixture of them to enhance perpendicular anisotropy (PMA).

Figure 4:
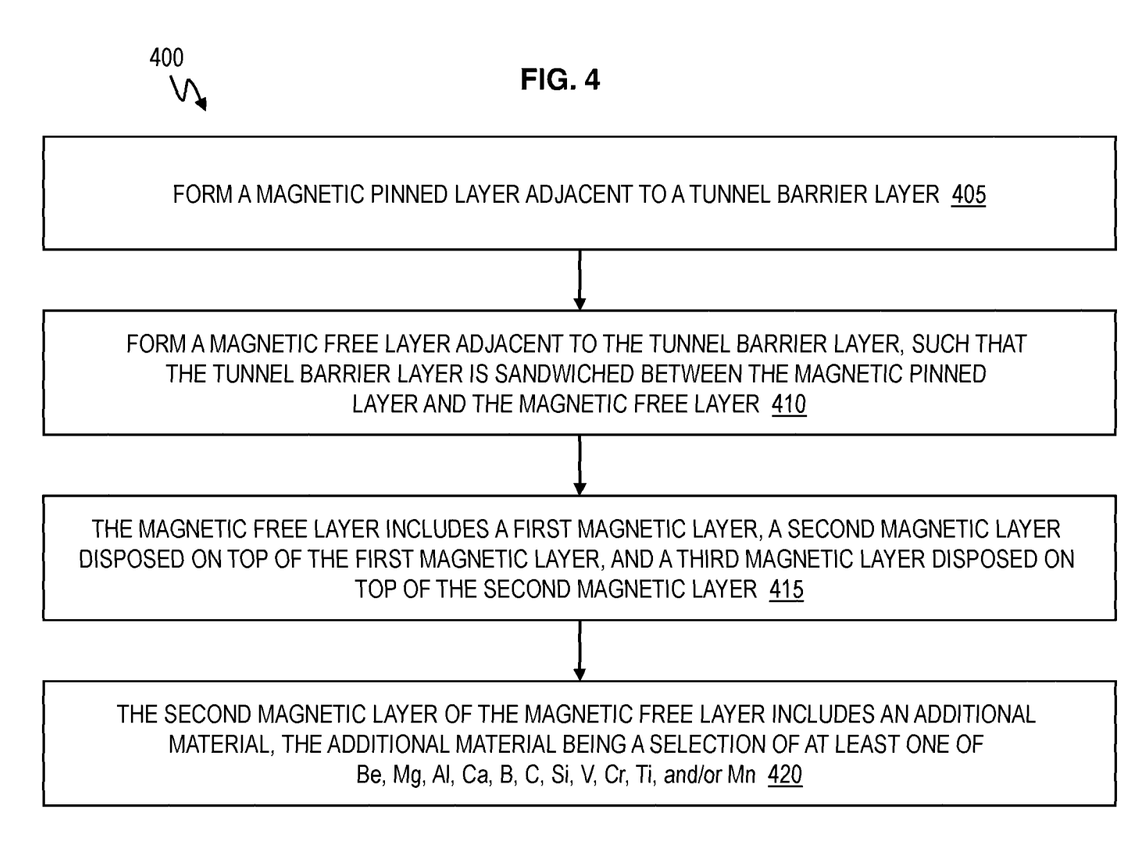
FIG. 4 is a flow chart of a method of forming a semiconductor device, such as the STT MRAM device, according to one or more embodiments.

FIG. 4 is a flow chart of a method 400 of forming a semiconductor device, such as the spin torque transfer (STT) MRAM device 100 according to one or more embodiments.

At block 405, a magnetic pinned layer 105 is formed adjacent to a tunnel barrier layer 110.

At block 410, a magnetic free layer 115 is formed adjacent to the tunnel barrier layer 110, such that the tunnel barrier layer 110 is sandwiched between the magnetic pinned layer 105 and the magnetic free layer 115.

At block 415, the magnetic free layer 115 includes a first magnetic layer 205, a second magnetic layer 210 disposed on top of the first magnetic layer 205, and a third magnetic layer 215 disposed on top of the second magnetic layer 210.

At block 420, the second magnetic layer 210 of the magnetic free layer 115 includes an additional material (i.e., light elements discussed herein are the additional materials), and the additional material are a selection of at least one of Be, Mg, Al, Ca, B, C, Si, V, Cr, Ti, and/or Mn.

The first magnetic layer 205 includes at least one of Co, Fe, and/or CoFeB. The first magnetic layer 205 has a thickness ranging from 0.5 to 1.0 nanometers.

The second magnetic layer 210 includes at least one of Co, Fe, and/or CoFeB. The second magnetic layer has a thickness ranging from 0.15 to 1.5 nanometers. In one implementation, the second magnetic layer 210 is a single layer and the additional material (i.e., light elements discussed herein) constitutes 10-80% of the second magnetic layer 210.

In another implementation, the second magnetic layer 210 is a multilayered structure. The second magnetic layer 210 includes a combination of a magnetic layer 310 and a non-magnetic layer 305 to form the multilayered structure. The magnetic layer 310 includes at least one of Co, Fe, and/or CoFeB. The magnetic layer 310 has a thickness from 0.05 to 0.5 nanometers, and the non-magnetic layer 305 has a thickness from 0.05 to 0.5 nanometers. The non-magnetic layer 305 includes the additional material (i.e., the light elements discussed herein), and the combination of the magnetic layer 310 and the non-magnetic layer 305 repeats for 0-5 occurrences. The non-magnetic layer 305 is repeated with one or more different kinds of the additional material (Be, Mg, Al, Ca, B, C, Si, V, Cr, Ti, and/or Mn).

The third magnetic layer 215 includes at least one of Co, Fe, and/or CoFeB, and the third magnetic layer 215 has a thickness ranging from 0.1 to 0.5 nanometers.

Figure 5A:
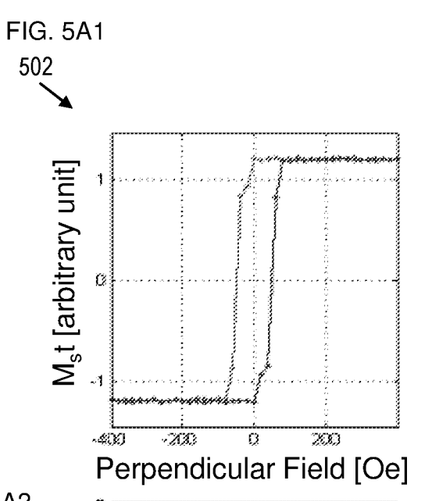

FIG. 5A1 is a graph 502 depicting magnetization versus perpendicular field loop of a conventional free layer with a total thickness of 18 Å and an effective CoFeB thickness of 18 Å.

Figure 5A:
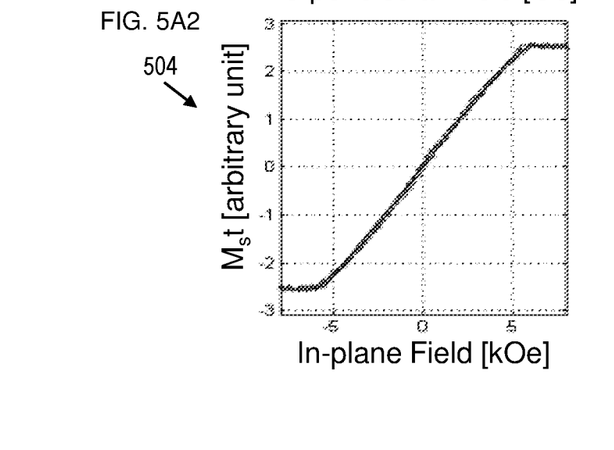

FIG. 5A2 is a graph 504 depicting magnetization versus in-plane field loop of a conventional free layer with a total thickness of 18 Å and an effective CoFeB thickness of 18 Å.

Figure 5B:
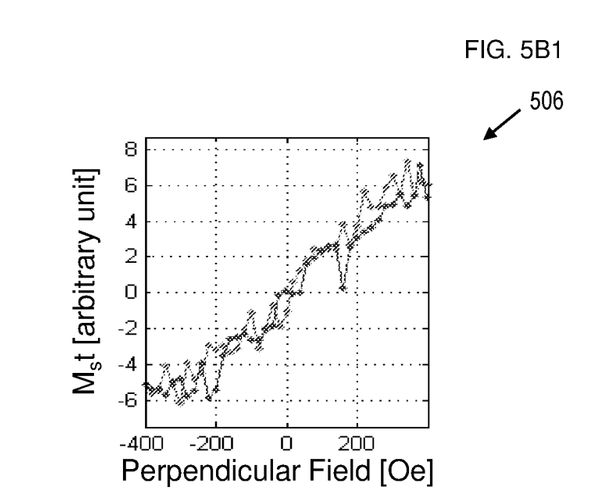

FIG. 5B1 is a graph 506 depicting magnetization versus perpendicular field loop of a conventional free layer with a total thickness of 12 Å and an effective CoFeB thickness of 12 Å.

Figure 5B:
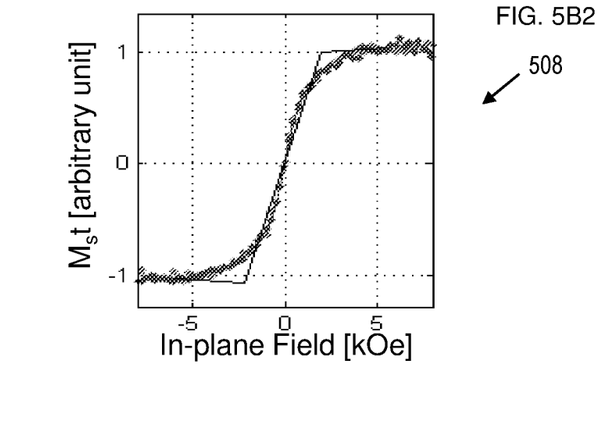

FIG. 5B2 is a graph 508 depicting magnetization versus in-plane field loop of a conventional free layer with a total thickness of 12 Å and an effective CoFeB thickness of 12 Å.

With respect to FIGS. 5A1, 5A2, 5B1, 5B2, when the free layer thickness is reduced to 12 Å, the film becomes discontinuous and weakly exchange coupled together.

Figure 5C:
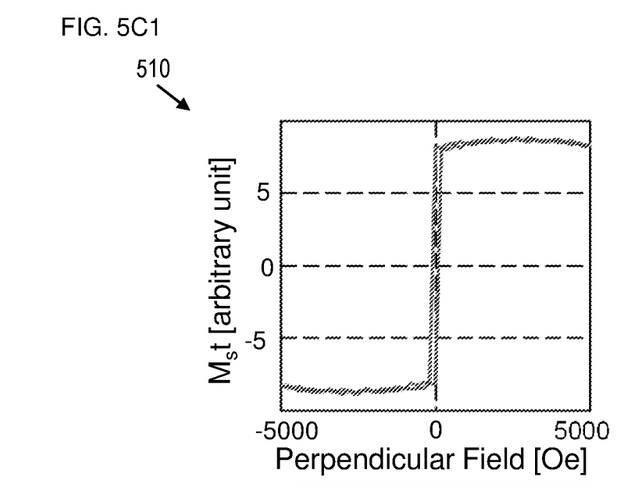
Figure 5C:
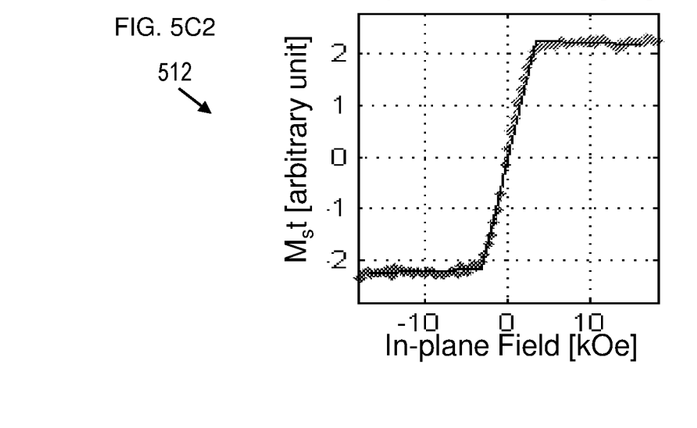

FIG. 5C1 is a graph 510 depicting magnetization versus perpendicular field loop of a free layer doped with Mg metal to have a total thickness of 17 Å and an effective CoFeB thickness of 12 Å according to one or more embodiments. FIG. 5C2 is a graph 512 depicting magnetization versus in-plane field loop of a free layer doped with Mg metal to have a total thickness of 17 Å and an effective CoFeB thickness of 12 Å according to one or more embodiments.

In accordance with one or more embodiments, when the free layer is laminated by multiple Mg layers, thus, increasing the total thickness of the free layer to 17 Å, a continuous free layer with strong exchange coupling is achieved (proven by the sharp M-H loop along the perpendicular direction shown in FIG. 5C1), while maintaining the effective CoFeB thickness of 12 Å.

Figure 5D:
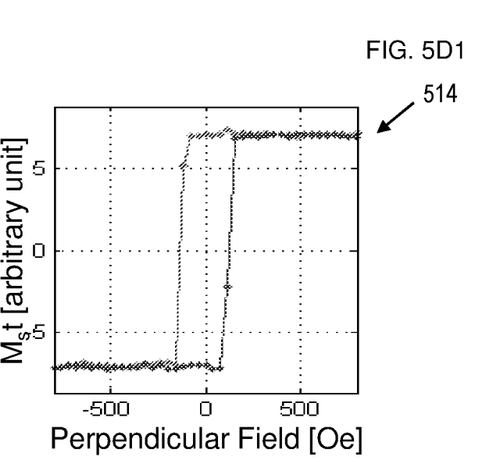
Figure 5D:
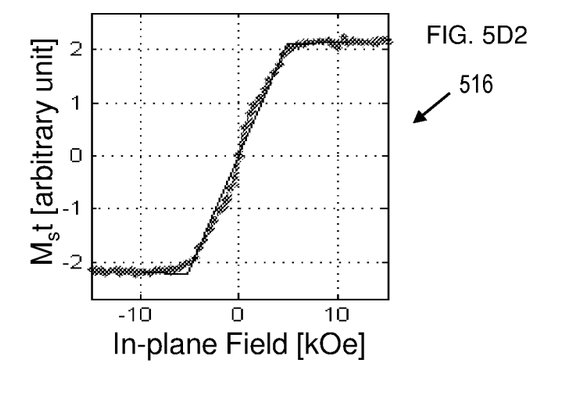

FIG. 5D1 is a graph 514 depicting magnetization versus perpendicular field loop of a free layer doped with Ti metal to have a total thickness of 14 Å and an effective CoFeB thickness of 12 Å according to one or more embodiments. FIG. 5D2 is a graph 516 depicting magnetization versus in-plane field loop of a free layer doped with Ti metal to have a total thickness of 14 Å and an effective CoFeB thickness of 12 Å according to one or more embodiments.

To lower free layer moment according to one or more embodiments, FIGS. 5D1, 5D2 show that a similar effect was achieved when inserting a 2 Å Ti layer into the free layer, where the total thickness was increased to 14 Å while maintaining the effective CoFeB thickness at 12 Å. In both cases (FIGS. 5C1, 5C2 and FIGS. 5D1, 5D2), the free layer moment of the free layer 115 was successfully reduced by light element doping/lamination.

It should be appreciated that the design for semiconductor devices may be included in or utilize features an integrated circuit layout. An integrated circuit (IC) layout is also known as an IC layout, IC mask layout, or mask design. The integrated circuit layout is the representation of an integrated circuit in terms of planar geometric shapes which correspond to the patterns of metal, oxide, semiconductor layers, etc., that make up the components of the integrated circuit. Such an integrated circuit layout, including the layout of a semiconductor device, may be stored in a computer readable medium in preparation for fabrication as understood by one skilled in the art Technical effects and benefits include improved semiconductor devices, such as, e.g., improved memory devices (i.e., STT MRAM devices) on an integrated circuit. The improved STT MRAM devices can improve a computer processor, a memory device, etc. The technical effects further include faster switching of the free layer in the magnetic tunnel junction, a lower moment of the free layer, and a thinner free layer.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor device, the method comprising:
    forming a magnetic pinned layer adjacent to a tunnel barrier layer; and
    forming a magnetic free layer adjacent to the tunnel barrier layer, such that the tunnel barrier layer is sandwiched between the magnetic pinned layer and the magnetic free layer;
    wherein the magnetic free layer includes a first magnetic layer, a second magnetic layer disposed directly on top of the first magnetic layer, and a third magnetic layer disposed directly on top of the second magnetic layer; and
    wherein the second magnetic layer of the magnetic free layer includes an additional material, the additional material being selected from the group consisting of Be, Ca, V, and Cr.

2. The method of claim 1, wherein the first magnetic layer includes at least one of Co, Fe, and CoFeB.

3. The method of claim 1, wherein the first magnetic layer has a thickness ranging from 0.5 to 1.0 nanometers.

4. The method of claim 1, wherein the second magnetic layer includes at least one of Co, Fe, and CoFeB.

5. The method of claim 1, wherein the second magnetic layer has a thickness ranging from 0.15 to 1.5 nanometers.

6. The method of claim 5, wherein the second magnetic layer is a single layer.

7. The method of claim 6, wherein the additional material constitutes 10-80% of the second magnetic layer.

8. The method of claim 1, wherein the second magnetic layer is a multilayered structure.

9. The method of claim 1, wherein the second magnetic layer includes a combination of a thin magnetic layer and a thin non-magnetic layer to form a multilayered structure.

10. The method of claim 9, wherein the thin magnetic layer includes at least one of Co, Fe, and CoFeB.

11. The method of claim 9, wherein the thin magnetic layer has a thickness from 0.05 to 0.5 nanometers; and
wherein the non-magnetic layer has a thickness from 0.05 to 0.5 nanometers.

12. The method of claim 9, wherein the non-magnetic layer includes the additional material.

13. The method of claim 12, wherein the combination of the magnetic layer and the non-magnetic layer repeats for 0-5 occurrences.

14. The method of claim 13, wherein the non-magnetic layer is repeated with one or more different kinds of the additional material.

15. The method of claim 1, wherein the third magnetic layer includes at least one of Co, Fe, and CoFeB; and
wherein the third magnetic layer has a thickness ranging from 0.1 to 0.5 nanometers.

16. A semiconductor device comprising:
a magnetic pinned layer adjacent to a tunnel barrier layer; and
a magnetic free layer adjacent to the tunnel barrier layer, such that the tunnel barrier layer is sandwiched between the magnetic pinned layer and the magnetic free layer;
wherein the magnetic free layer includes a first magnetic layer, a second magnetic layer disposed directly on top of the first magnetic layer, and a third magnetic layer disposed directly on top of the second magnetic layer; and
wherein the second magnetic layer of the magnetic free layer includes an additional material, the additional material being selected from the group consisting of Be and V.

17. The semiconductor device of claim 16, wherein the first magnetic layer includes at least one of Co, Fe, and CoFeB.

18. The semiconductor device of claim 16, wherein the first magnetic layer has a thickness ranging from 0.5 to 1.0 nanometers.

19. The semiconductor device of claim 16, wherein the second magnetic layer includes at least one of Co, Fe, and CoFeB.

20. A semiconductor device comprising:
a magnetic pinned layer adjacent to a tunnel barrier layer; and
a magnetic free layer adjacent to the tunnel barrier layer, such that the tunnel barrier layer is sandwiched between the magnetic pinned layer and the magnetic free layer;
wherein the magnetic free layer includes a first magnetic layer, a second magnetic layer disposed on top of the first magnetic layer, and a third magnetic layer disposed on top of the second magnetic layer;
wherein the second magnetic layer of the magnetic free layer includes an additional material, the additional material including Cr; and
wherein the second magnetic layer is a single layer and the additional material constitutes 10-80% of the second magnetic layer.

* * * * *